(12) United States Patent
Samarao et al.

(10) Patent No.: US 9,511,998 B2
(45) Date of Patent: Dec. 6, 2016

(54) MEMS DEVICE HAVING A GETTER

(71) Applicant: Robert Bosch GmbH, Stuttgart (DE)

(72) Inventors: Ashwin Samarao, Mountain View, CA (US); Gary O'Brien, Palo Alto, CA (US); Ando Feyh, Palo Alto, CA (US); Gary Yama, Mountain View, CA (US); Andrew Graham, Redwood City, CA (US); Bongsang Kim, Mountain View, CA (US); Fabian Purkl, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 89 days.

(21) Appl. No.: 14/207,752

(22) Filed: Mar. 13, 2014

(65) Prior Publication Data

US 2016/0137493 A1    May 19, 2016

Related U.S. Application Data

(60) Provisional application No. 61/779,042, filed on Mar. 13, 2013.

(51) Int. Cl.
*H01L 21/322* (2006.01)
*B81C 1/00* (2006.01)
*H01L 23/28* (2006.01)

(52) U.S. Cl.
CPC ....... *B81C 1/00285* (2013.01); *H01L 21/3223* (2013.01); *H01L 21/3225* (2013.01); *H01L 23/28* (2013.01); *B81C 2201/0115* (2013.01); *B81C 2203/0109* (2013.01); *B81C 2203/0118* (2013.01); *B81C 2203/035* (2013.01)

(58) Field of Classification Search
CPC ... H01L 23/28; H01L 21/3223; H01L 21/3225

USPC .......................................................... 438/50
See application file for complete search history.

(56) References Cited

U.S. PATENT DOCUMENTS

| | | | |
|---|---|---|---|
| 2006/0137460 A1 | 6/2006 | Lammel et al. | |
| 2011/0079425 A1* | 4/2011 | Baillin | B81C 1/00285 174/521 |
| 2012/0228733 A1 | 9/2012 | Garcia-Blanco et al. | |
| 2014/0037869 A1* | 2/2014 | Petrmichl | E06B 3/6612 428/34 |
| 2015/0037685 A1* | 2/2015 | Goller | H01M 2/1673 429/246 |

FOREIGN PATENT DOCUMENTS

| | | |
|---|---|---|
| KR | 1020050113243 A | 12/2005 |
| KR | 1020060092914 A | 8/2006 |
| KR | 1020110095117 A | 8/2011 |

OTHER PUBLICATIONS

International Search Report and Written Opinion corresponding to PCT Application No. PCT/US2014/025498, mailed Jul. 22, 2014 (10 pages).

* cited by examiner

*Primary Examiner* — Amar Movva
(74) *Attorney, Agent, or Firm* — Maginot Moore & Beck LLP

(57) ABSTRACT

A microelectromechanical system (MEMS) device includes a high density getter. The high density getter includes a silicon surface area formed by porosification or by the formation of trenches within a sealed cavity of the device. The silicon surface area includes a deposition of titanium or other gettering material to reduce the amount of gas present in the sealed chamber such that a low pressure chamber is formed. The high density getter is used in bolometers and gyroscopes but is not limited to those devices.

12 Claims, 7 Drawing Sheets

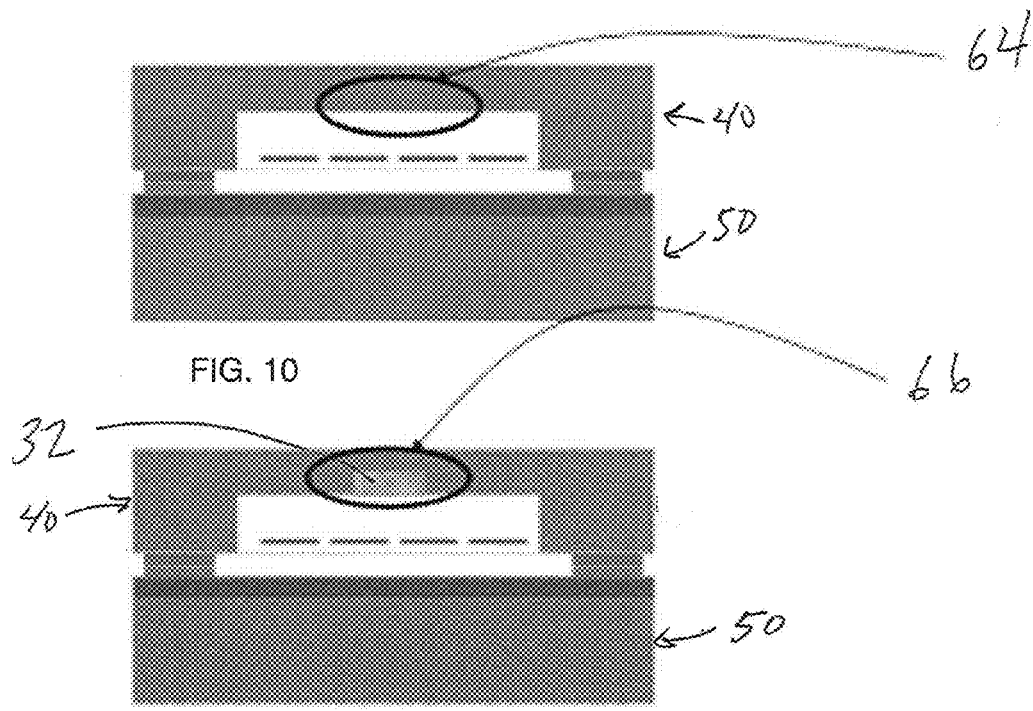
FIG. 10
FIG. 11
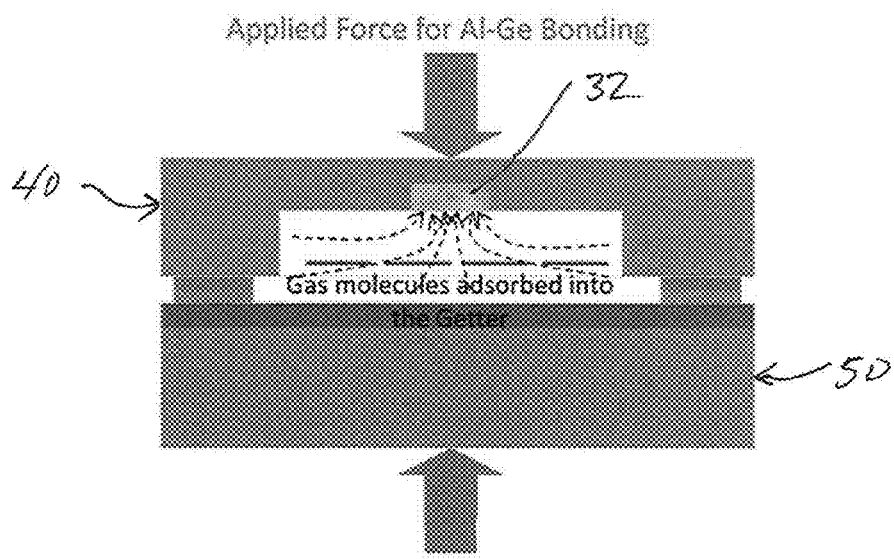
FIG. 12

MEMS DEVICE HAVING A GETTER

CROSS-REFERENCE TO RELATED APPLICATIONS

This application claims priority to U.S. Provisional Application Ser. No. 61/779,042 entitled "MEMS DEVICE HAVING A GETTER" by Samarao et al., filed Mar. 13, 2013, the disclosure of which is hereby incorporated herein by reference in its entirety.

TECHNICAL FIELD

This disclosure relates to a microelectromechanical system (MEMS) device and more particularly to a getter for a MEMS device.

BACKGROUND

MEMS devices, including bolometers and gyroscopes, require that the devices are sealed at very low pressures of from 1 to 100 μBar to achieve increased sensitivity and to thereby provide a good signal to noise ratio. Typically these devices are micro fabricated on the MEMS wafer and are sealed inside a cavity that is formed as a recess in a cap wafer. The MEMS and cap wafers are typically bonded together using various wafer bonding schemes like eutectic bonding or thermo compression or glass frit bonding. In all of these bonding scenarios, the sealed cavity is approximately at the same pressure level as is present during the bonding of the wafer. The typical pressure levels to achieve bonding is carried out is approximately 1 mBar. As a result, there is a need to further reduce the pressure in the sealed cavity up to three orders of magnitude down to 1 μBar. Typically, "Getters" are used for this purpose. The inner walls of the sealed cavity are coated at selective locations with a getter material. A getter material is one that combines with the gas molecules in the cavity either chemically or via adsorption and increases the level of vacuum (or decreases the pressure) in the cavity. At times these getter materials might require an elevated temperature to "activate" gettering of the gas molecules.

The efficiency of a getter is strongly dependent on the surface area which is exposed to the gas molecules. The larger the surface area, the more gas molecules are adsorbed into the getter and thereby evacuated from the chamber leading to lowered pressure levels. Since the available surface area on the inside of a sealed cavity is limited, the surface area for creating a getter having improved performance is limited. Deep trenches on the interior surface of the sealed cavity using processes such as Deep Reactive Ion Etching (DRIE) could be implemented to increase the surface area to some extent. However, the need for more efficient getters continues to exist as the MEMS packages continue to shrink in size (especially in Consumer Electronics). Of course, smaller MEMS packages have reduced surface areas and therefore there is less area in which the trench patterns can be formed by DRIE.

Consequently, there is a need for a getter which can reduce the pressure in the sealed cavity to desirable levels. By reducing the pressure in the sealed cavity, better performance of the MEMS devices can be achieved.

BRIEF DESCRIPTION OF DRAWINGS

FIG. 10 is a schematic cross-sectional view of a bolometer having an upper portion without a getter.

FIG. 11 is a schematic cross-sectional view of a bolometer having an upper portion with a getter.

FIG. 12 is a schematic cross-sectional view of a bolometer illustrating the adsorption of gas molecules by a getter.

DESCRIPTION

Figure 1:
FIGS. 1-7 depict a procedure which can be used to form a getter in a silicon substrate used as an upper portion of a bolometer.
Figure 2:
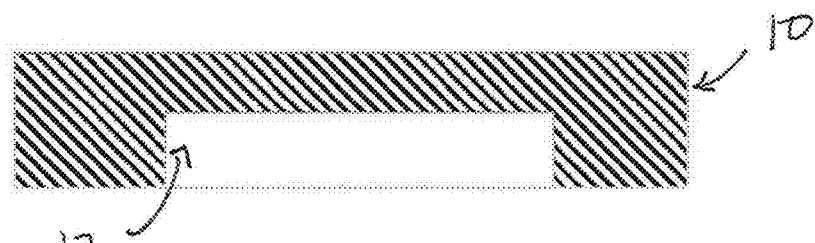
Figure 3:

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

The present disclosure relates to reducing the pressure within the sealed cavity of a MEMS device by providing selective porosification of the silicon surface within the sealed cavity. By porosifying the silicon surface within the cavity, the amount of surface area is greatly increased. Once the increased surface area is formed, a coating, such as Titanium is applied to the porosified surface area where the Titanium is deposited via Atomic Layer Deposition.

Titanium is known to be one of the better getter materials that is readily available, efficient, and CMOS-compatible. The material is also relatively inexpensive and is readily deposited using Atomic Layer Deposition (ALD). By selecting the parameters of the porosification process, the diameter of the pores achieved in the silicon substrate are made as small as 2-5 nanometers (nm). In addition, the duration of the porosification process is selected to achieve a porous silicon layer having thicknesses of more than 100 micrometers (μm). Such high density getters provide benefits to a wide variety and types of devices that demand higher levels of vacuum for operation, even devices which are not considered to be a MEMS device.

Devices like MEMS bolometers rely on the absorption efficiency of the infrared waves followed by a subsequent heating up of the thermistor material (in this case, Platinum) for enhanced responsivity and sensitivity. At relatively higher pressure levels, like 1 mBar, the heat loss through convection from the bolometer to the surrounding structure is very high. As a result, conversion of the absorbed infrared electromagnetic energy into thermal energy is immediately lost to the surroundings as heat, thereby reducing the amount of thermal energy needed to make an accurate determination of the amount of absorbed infrared electromagnetic energy. Since a bolometer uses the thermal energy to provide a change in resistance (i.e., thermistor), any loss of thermal energy reduces the accuracy of the reading. However, at very low pressures like 1 µBar, the heat loss due to convection is significantly minimized and the only possible mechanisms for heat conduction at such low pressure levels are conduction and radiation, with radiation being significantly smaller than conduction. When the pressure within the cavity is significantly reduced, the thermistor behavior is easily sensed by the interfaced external circuitry and a higher responsivity is achieved from the bolometer.

According to one embodiment, a method of fabricating a semiconductor device includes forming a cavity in a first substrate, and forming a passivation layer within the cavity. A getter location is defined within the cavity at which the substrate is exposed through the passivation layer. The substrate is then porosified at the getter location to form pores. A getter is then deposited on the getter location such that the getter enters the pores and coats surfaces within the pores. The passivation layer is then removed.

The first substrate may comprise a cap wafer that is subsequently bonded to a second substrate with the cavity facing the second substrate. The getter is activated to reduce pressure within the cavity. In one embodiment, the getter comprises titanium. The titanium is deposited using an atomic layer deposition process and any titanium deposited on the passivation layer is removed along with the passivation layer. In one embodiment, the getter location is porosified to form pores having sizes within in a range from 2 nm up to 2 µm. The pores may be formed using an electrochemical etching process or by exposing the getter location to light.

Bonding contacts may be formed on the first substrate around the cavity and on the second substrate for bonding the substrates together using a bonding process which forms a seal around the cavity. In one embodiment, the bonding process is used to activate the getter. In one embodiment, the bonding contacts are formed of aluminum and germanium so that an Al—Ge eutectic bonding process may be used. The first and the second bonding contacts are exposed to a bonding temperature during the eutectic bonding process, and the bonding temperature may be used to activate the getter. The second substrate may include a MEMS device, such as bolometer sensor. The bolometer is positioned within the cavity when the substrates are bonded together. In this embodiment, the first substrate comprises a cap wafer for the bolometer.

FIGS. 1-7 depict a process for forming a getter in a silicon substrate. The process begins with a substrate 10 as shown in FIG. 1. The substrate 10 may comprise silicon substrate, or wafer. The silicon substrate 10 is etched by known techniques to form a cavity 12 in one side of the substrate 10 which will serve as a portion of a cavity, or gap, for the bolometer. Once the cavity 12 is formed, bonding contacts 14, 16 are formed on the surfaces of the substrate portions 18, 20 surrounding the cavity 12. In one embodiment, the contacts 14, 16 are formed of germanium which is deposited on the portions 18 and 20. As discussed below, the germanium may be used for Al—Ge eutectic bonding.

Once the etched silicon substrate 10 includes the contacts 14, 16, a passivation layer 22 is formed on the exposed portions of the etched silicon substrate 10 and over the contacts 14, 16 which will be used to shield these areas during subsequent porosification processing. The passivation layer 22 may be formed by depositing a material, such as silicon nitride, photo-resist or other passivation material, onto the substrate. The passivation layer 22 may also be formed by doping. For example, the substrate may comprise a lightly p-doped silicon wafer. A passivation layer may be formed by lightly or heavily doping the substrate with a p-type dopant. This results in good selectivity so that during subsequent processing, e.g., by electrochemical etching, only p-doped areas are porosified.

Figure 4:
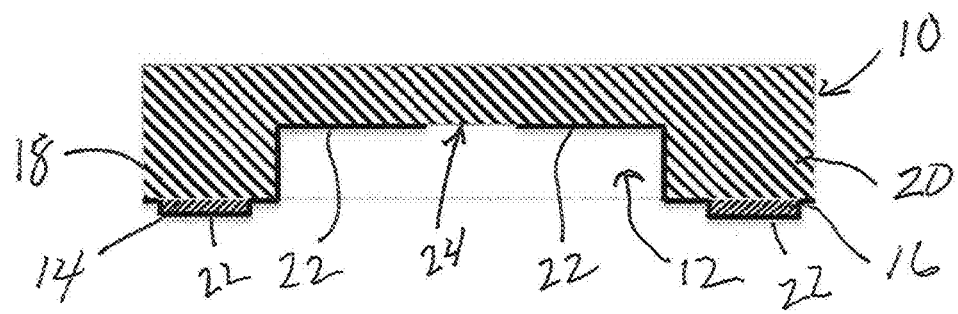

As can be seen in FIG. 4, the passivation layer is formed on the bottom surface of the substrate portions 18, 20, over the contacts, 14, 16, and on the side walls and base of the cavity 12. A portion 24 of the base of the cavity is intended for porosification and is exposed through the passivation layer 22. The portion 24 may be exposed in any suitable manner depending on the type of passivation used.

Figure 5:
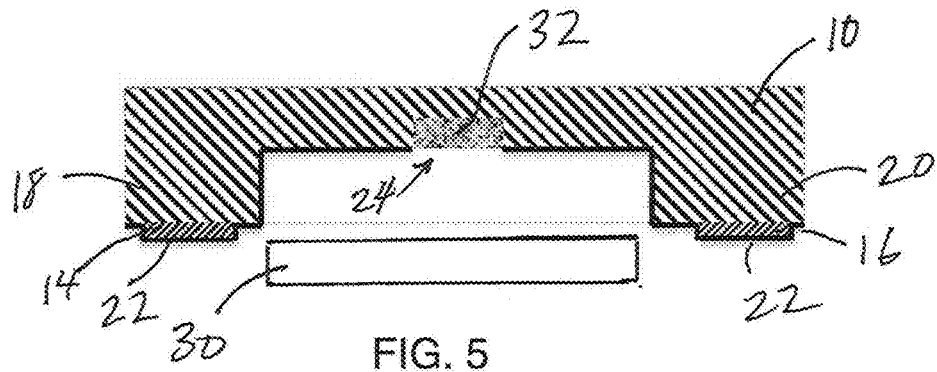
Figure 6:
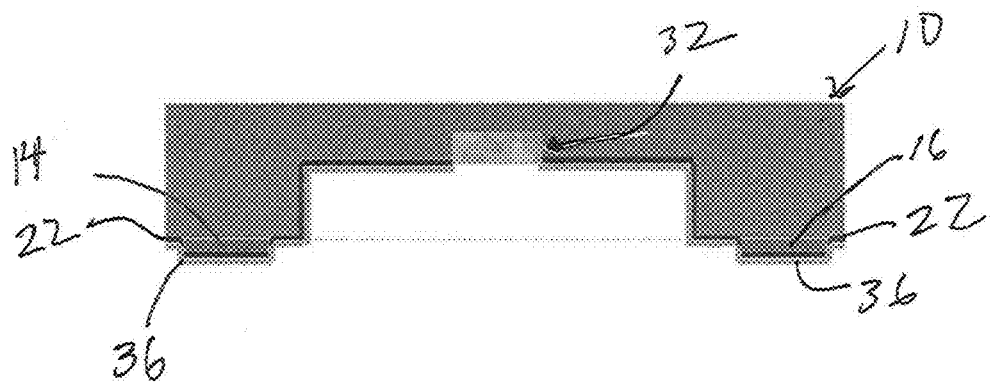

Referring to FIG. 5, once the passivation material has been deposited, the substrate 10 is processed in a manner that porosifies the portion 24 of the substrate, e.g., by causing the formation of pores and/or by increasing the size of pores in the portion 24. In one embodiment, to porosify a silicon substrate, an electrochemical technique is applied using a platinum electrode 30 as a cathode and the silicon substrate 10 as an anode. Through application of the electrochemical technique, a defined portion of the silicon substrate 10 becomes porosified to form a porosified portion 32. The desired range of pore diameters is from 2 nm up to 2 um.

Once the porosified portion 32 is formed, titanium is deposited on the bottom surface of the substrate and in the cavity 12 which forms a titanium layer 36 over the passivation layer 22. The titanium deposited onto the porosified portion 32 enters the pores and coats the exposed surfaces within the porosified portion 32 which is why the titanium layer 36 does not appear over the portion 32 in FIG. 6.

Figure 7:
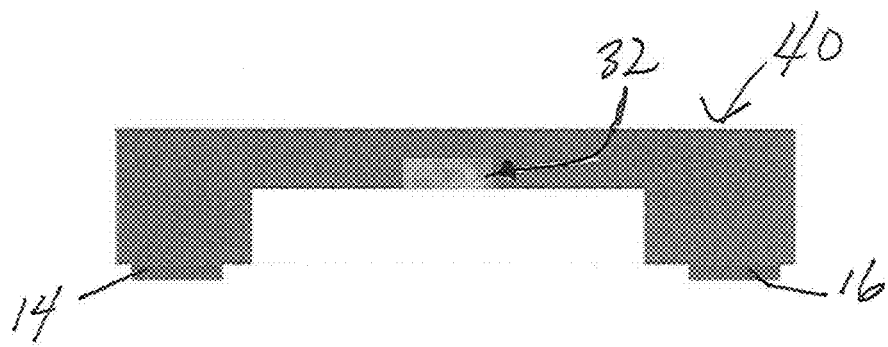
Figure 8:
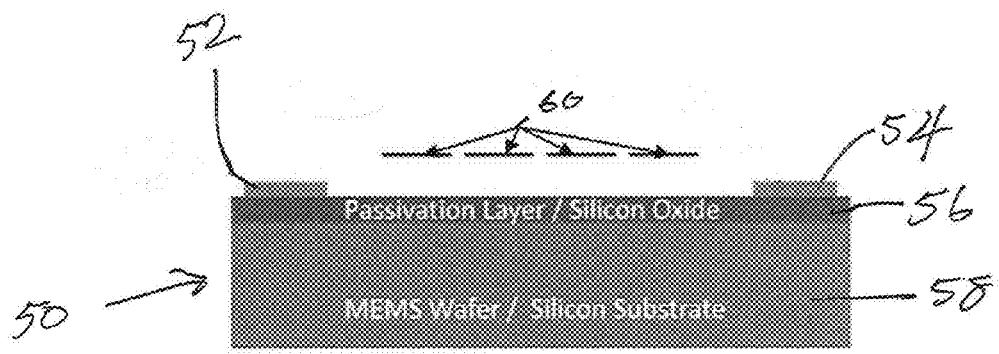
FIG. 8 bottom portion of the bolometer formed of a silicon substrate, ALD bolometers, and aluminum contacts.
Figure 9:
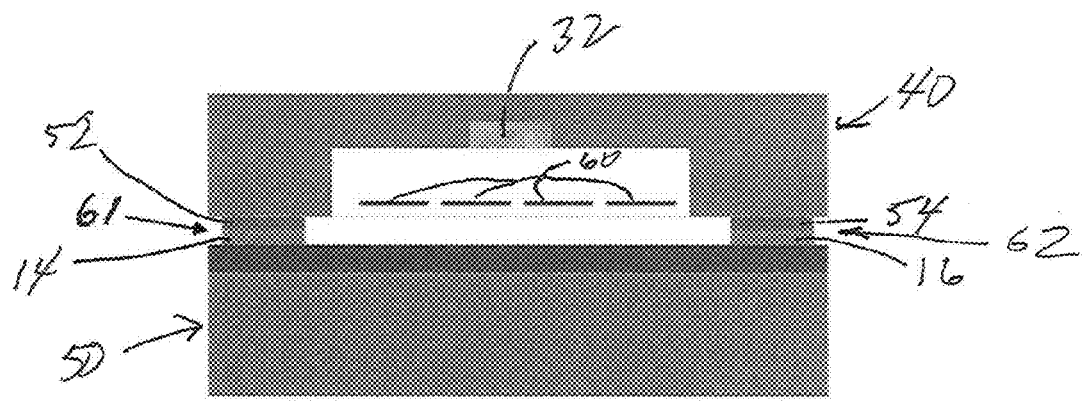
FIG. 9 is a schematic cross-sectional view of an upper portion and a lower portion bonded together to form a bolometer.

Referring to FIG. 7, the titanium layer 36 and passivation layer 22 are then removed from the substrate to expose the contacts 14, 16 and the walls of the cavity 12. As a result, a silicon cap wafer 40 is formed, having a getter 32, which can be bonded to a second substrate 50 (FIG. 8) which forms the bottom portion of the bolometer. As depicted in FIG. 8, the substrate 50, which may comprise a silicon substrate and/or a MEMS wafer, includes bonding contacts 52, 54, e.g., aluminum bonding contacts, which are configured to bond with the contacts 14, 16 on the cap wafer 40. The contacts 52, 54 are formed on an oxide layer/passivation layer on the substrate 40. The substrate 50 includes one or more thin, flexible membranes 60, e.g., formed using an ALD process, which are suspended a distance above the layer 56 of the substrate 50 and form one or more bolometer sensors.

The cap wafer 40 is bonded to the bottom portion 50 by positioning the cavity 12 over the bolometers 60 and bonding the bonding contacts 14, 16 on the cap wafer to the bonding contacts 52, 54 at locations 61, 62 on the substrate 50. In one embodiment, the bonding contacts 14, 16 are formed of germanium and the bonding contacts 52, 54 which allows Al—Ge eutectic bonding to be used. As a result, the bolometers 60 are enclosed and sealed within a cavity formed between the cap wafer 40 and substrate 50.

The performance capabilities and responsivity of a bolometer depends in part on the pressure sealed within the cavity which affects heat loss via convection. To minimize heat loss via convection, the pressure sealed within the cavity is made as low as possible. The sealed pressure is typically controlled by the bonding techniques used to bond the wafers together which results in the sealed pressure corresponding typically to the pressure within the bonding chamber. For example, FIG. 10 illustrates a capped cavity without the titanium getter 32 as indicated by the circled portion 64. Without the getter 32, the cavity is sealed at approximately the same pressure as the bonding chamber during the Al—Ge eutectic bonding. Typically these values are around 1 mBar. To increase bolometer responsivity, lower sealed pressures are required that are a few orders of magnitude lower than 1 mBar, e.g., down to 1-100 µBar.

A cap wafer 40 including a getter 32 in accordance with the disclosure enables the sealed pressure within the cavity to be decreased during and after bonding. Referring to FIG. 11, the getter 32 formed of titanium and porous silicon acts as a very high density getter material. The getter 32 combines with the gas molecules in the cavity either chemically or via adsorption and increases the level of vacuum (or decreases the pressure) in the cavity. Because the silicon has been porosified, instead of a thin film of Titanium acting as a getter, the Titanium coated onto a very high surface area material, like porous silicon, provides the Titanium covered high surface area. Because of this high surface area coated with titanium, a contacting surface is exposed to an increased number of gas molecules in a given time in the cavity and leads to a much lower pressure level thereby acting as an efficient getter.

FIG. 12 illustrates the mating of the upper portion 40 to the lower portion 50 through applied pressure and heat. Once the internal cavity of the bolometer is sealed, the getter 32 adsorbs the gas molecules. Any getter material, including titanium, typically needs a temperature of 300 to 500° C. to activate "gettering". Eutectic Al—Ge bonding temperatures are 435° C. to 475° C. and are applied for a period of 1-2 hours which allows the bonding process to serve as the getter activation step as well.

Figure 13:
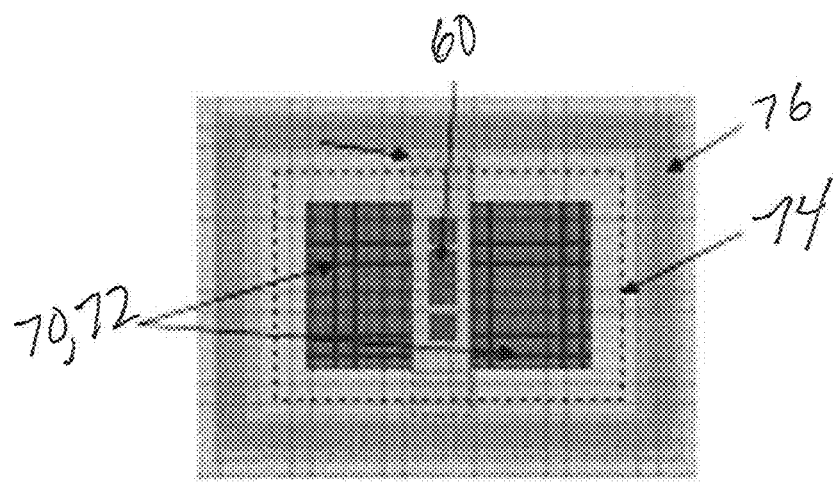
FIG. 13 is a schematic top view of a bolometer showing potential locations for the getter or getters.

FIG. 13 is a schematic top view of a bolometer showing potential locations for the getter or getters. The getter or getters are positioned such that a getter does not block the exposure of the ALD bolometer pixels to the infrared rays. For instance, ALD bolometers 60 are not blocked by a getter 70 and a getter 72. A dotted line illustrates a cavity recess boundary 74 in the cap 40. An aluminium germanium bonding ring 76 is shown outside the cavity recess boundary 74.

Figure 14:
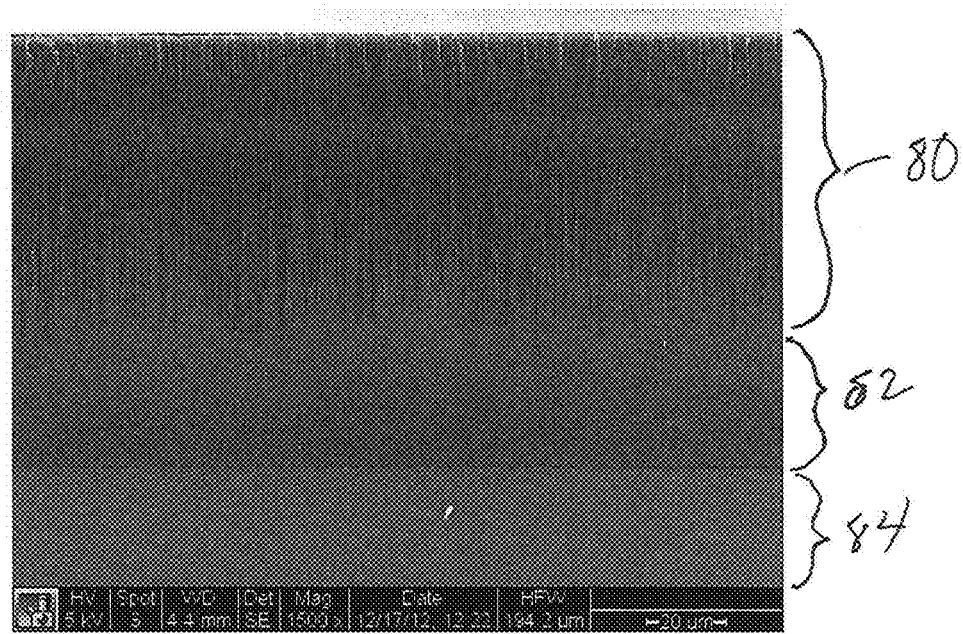
FIG. 14 is an image of depositing Alumina into porous silicon, e.g. using atomic layer deposition.

Deposition of titanium into the mesoporous or nanoporous silicon material cannot be accomplished using conventional deposition techniques like chemical vapour deposition (CVD) or physical vapour deposition (PVD) techniques. However, ALD remains a viable technique for coating porous silicon deep into its pores as small as 10 nm in diameter. As an example and as illustrated in FIG. 14, ALD Alumina has been coated successfully for as deep as 30 µm into a porous silicon substrate using thermal ALD as shown at location 80. In addition, partial diffusion has been observed in a remaining 20 µm of porous silicon as shown at location 82. Bulk silicon is shown at location 84. In other embodiments, precursor species like Tetrakis-Dimethyl-Amido Titanium (or TDMAT) are used for ALD of Ti into Porous Silicon. Both Plasma-Enhanced and Thermal versions of ALD are also utilized.

Figure 15:
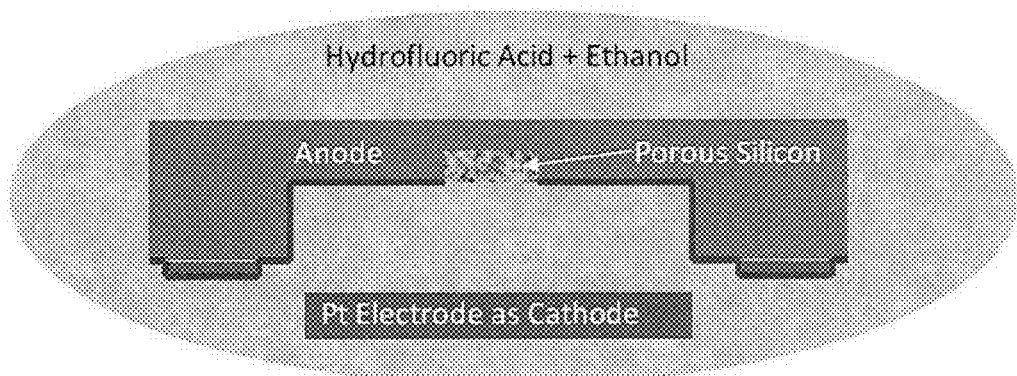
FIG. 15 is a schematic cross-sectional view of a top portion of the bolometer showing the porosification of a getter using the substrate as an anode and the platinum as a cathode.
Figure 16:
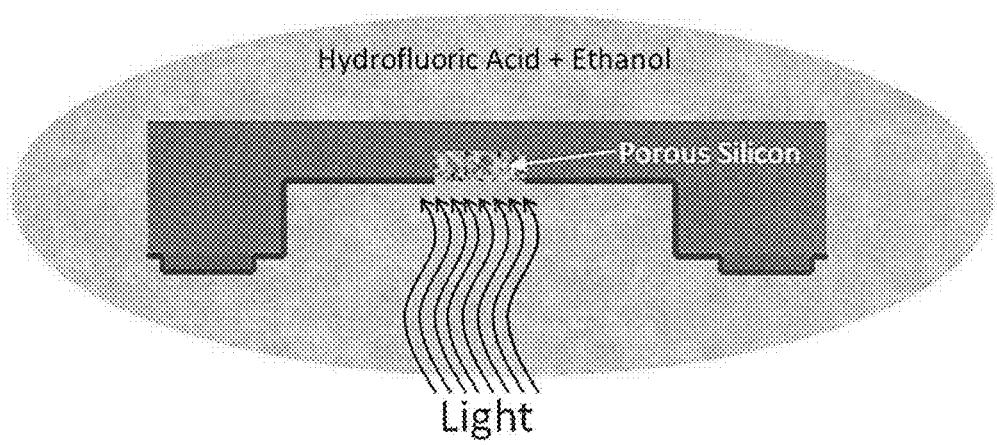
FIG. 16 is a schematic cross-sectional view of a top portion of the bolometer showing the porosification of the getter using light.

FIG. 15 is a schematic cross-sectional view of a top portion of the bolometer showing the porosification of the getter using the substrate as an anode and the platinum as a cathode as previously described. This method is also called electro-chemical etching/porosification. In FIG. 16, the getter is shown being formed through the application of light. In this embodiment, "electroless" or photo-assisted porosification is employed. Instead of using the substrate as an anode and a platinum electrode as Cathode as shown in FIG. 15, light is directed onto the substrate to stimulate carrier generation thereby facilitating subsequent porosification of silicon. This method is also called photo-assisted etching/porosification. Using photo-assisted porosification, substrates having the lowest doping can be porosified. This provides an advantage, as the wafer does not hinder infra-red transmission from the outside to the sensor element.

Figure 17:
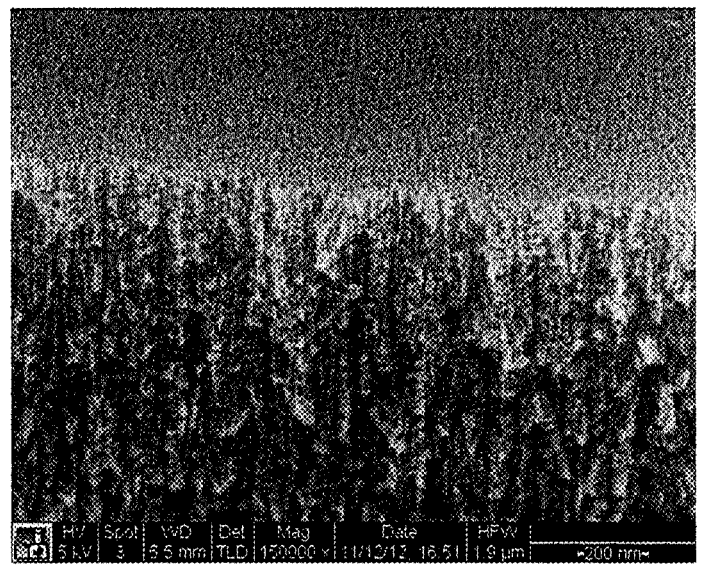
FIG. 17 is an image of porous silicon having an increase amount of surface area for forming a getter.
Figure 18:
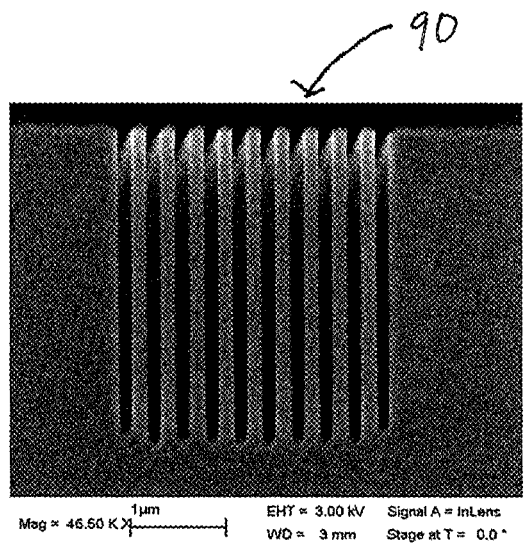
FIG. 18 is an image of a plurality of trenches in silicon to increase the amount of surface area for forming a getter.

As an alternative embodiment to porous silicon as shown in FIG. 17, a plurality of sub-micron wide trenches 90 (see FIG. 18) are etched in silicon to mimic a relatively high surface area. The amount of surface area provided in the embodiment of FIG. 18, however, is not as high as porous silicon where pores are as small as 2 to 5 nm. Once the trenches are formed, titanium deposited inside these trenches using ALD or other techniques. In other embodiments, a combination of trenched structures and the described porosification process is employed. (first trench, then porosify the surface of the trenched structure.

Those of skill in the art will recognize that the process described with reference to FIGS. 1-9 in other embodiments is modified to provide a variety of configurations designed for the particular embodiment.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of fabricating a microelectromechanical system (MEMS) device, the method comprising:
    forming a cavity in a first substrate, the first substrate comprising a silicon substrate;
    forming a passivation layer within the cavity;
    defining a getter location within the cavity at which the substrate is exposed through the passivation layer;
    porosifying the substrate at the getter location to form pores;
    depositing a getter on the getter location such that the getter enters the pores and coats surfaces within the pores;
    removing the passivation layer;
    bonding the first substrate to a second substrate with the cavity facing the second substrate, the second substrate including a MEMS device which is positioned in the cavity when the first substrate is bonded to the second substrate; and
    activating the getter.

2. The method of claim 1, wherein the getter comprises titanium.

3. The method of claim 2, wherein the titanium is deposited using an atomic layer deposition process.

4. The method of claim 3, wherein any titanium deposited on the passivation layer is removed with the passivation layer.

5. The method of claim 3, wherein the pores are sized within in a range from 2 nm up to 2 µm.

6. The method of claim 5, wherein the pores are formed using an electrochemical etching process.

7. The method of claim 5, wherein the pores are formed by exposing the getter location to light.

8. The method of claim 2, further comprising:
    forming first bonding contacts on the first substrate around the cavity;

forming second bonding contacts on the second substrate at positions complementary to the first bonding contacts; and performing bonding process to bond the first bonding contacts to the second bonding contacts such that a seal is formed around the cavity.

9. The method of claim 8, wherein the bonding process activates the getter.

10. The method of claim 9, wherein one of the first bonding contacts and the second bonding contacts comprises germanium, wherein the other of the first bonding contacts and the second bonding contacts comprises aluminum, and wherein the bonding process comprises an Al—Ge eutectic bonding process.

11. The method of claim 10, wherein the first and the second bonding contacts are exposed to a bonding temperature during the eutectic bonding process, and wherein the bonding temperature activates the getter.

12. The method of claim 11, wherein the MEMS device comprises at least one bolometer which is positioned within the cavity when the first substrate is bonded to the second substrate.

* * * * *